United States Patent [19]
Nomiya et al.

[11] 3,845,329
[45] Oct. 29, 1974

[54] FLIP-FLOP CIRCUIT

[76] Inventors: Kosei Nomiya, 2-47-16 Eifuku, Suginami-ku, Tokyo; Hiroto Kawagoe, 1211 Gakuennishi-machi, Tokyo, both of Japan

[22] Filed: Mar. 27, 1973

[21] Appl. No.: 345,474

[30] Foreign Application Priority Data
Mar. 27, 1972 Japan .............................. 47-29729

[52] U.S. Cl. .............................. 307/279, 307/247 R
[51] Int. Cl. .............................. H03k 3/286
[58] Field of Search .............................. 307/279, 247 R

[56] References Cited
UNITED STATES PATENTS
3,610,964 10/1971 Hatano .............................. 307/279
3,697,775 10/1972 Kane .............................. 307/279 X

*Primary Examiner*—John S. Heyman
*Attorney, Agent, or Firm*—Craig & Antonelli

[57] ABSTRACT

A flip-flop circuit comprising: a first, a second, a third, a fourth, a fifth, a sixth, and a seventh field effect transistor; wherein a first pulse signal is applied to the input electrode of said third field effect transistor, a second pulse signal substantially synchronized with said first pulse signal is applied to the input electrode of one of said fifth and sixth field effect transistors and to the input electrode of said fourth field effect transistor, an input signal is applied to the input electrode of the other of said fifth and sixth field effect transistors, and a third pulse signal having its phase different from that of said first pulse signal is applied to the input electrode of said seventh field effect transistor.

8 Claims, 9 Drawing Figures

FLIP-FLOP CIRCUIT

BACKGROUND OF THE INVENTION

1. Field of the Invention

The present invention relates to flip-flop circuits and more particularly to static flip-flop circuits using field effect transistors.

2. Description of the Prior Art

Flip-flop circuits comprised of insulated gate field effect transistors may be classified broadly as dynamic flip-flop circuits and static flip-flop circuits. The former type is simpler in construction than the latter but in some cases the latter is more desirable than the former with respect to data-holding ability.

FIG. 1 illustrates an example of a static flip-flop circuit comprised of field effect transistors. More specifically, this flip-flop circuit consists essentially of a first inverter circuit comprising transistors $T_1$ and $T_2$, a second inverter circuit comprising transistors $T_4$ and $T_5$, a third inverter circuit comprising transistors $T_6$ and $T_7$, and transistors $T_3$, $T_8$ and $T_9$ which are to serve for transfer gate purposes. The second and third inverter circuits are connected in cascade, and the output terminal of the third inverter circuit is connected to the input terminal of the second inverter circuit by way of the transfer gate transistor $T_8$, thereby forming a feedback loop where data is held. The contents of data held in the feedback loop depend on the output state of the first inverter circuit when the transfer gate transistor $T_3$ turns on. The transistors $T_8$ and $T_9$ receive at their gate electrodes a clock signal $\phi_2$, and the transistor $T_3$ at its gate electrode a clock control signal $\phi_{1x}$ with a phase different from that of the clock signal $\phi_2$.

The load transistors $T_2$, $T_5$ and $T_7$ receive at their drain electrodes a DC power supply $V_{DD}$, and at their gate electrodes a DC power supply $V_{GG}$ having a voltage higher than that of the DC power supply $V_{DD}$ by about the threshold voltage of the transistor.

In this circuit, the voltage applied to the gate electrodes of the transfer gate transistors $T_3$, $T_8$ and $T_9$ must stand as high a level (e.g., the same level as $V_{GG}$) as that applied to the load transistors $T_2$, $T_5$ and $T_7$, because of the known substrate effect. Hence, in the prior art, the clock pulse signal $\phi_2$ has been provided at a high voltage level by the use of suitable means such as an astable multivibrator outside the semiconductor integrated circuit device.

The clock control signal $\phi_{1x}$ is provided through a logic operation taken between a clock signal $\phi_1$ (not used in the circuit of FIG. 1), which is generated by an astable multivibrator or the like, at a high voltage and has a phase different from the clock signal $\phi_2$, and another pulse signal. This logic operation is performed in a logic circuit associated with the semiconductor integrated circuit in which the flip-flop circuit is formed. The logic output stands at nearly the same potential or as low a potential as the DC power supply $V_{DD}$. Generally, therefore, level conversion is required to be carried out outside the semiconductor integrated circuit device in order to raise the logic output voltage whereby a high level clock control signal is formed. One prior art improvement is the use of another power source for the semiconductor integrated circuit device, thereby increasing the output level of the logic circuit. This in turn necessitates additional external terminals installed on the integrated circuit device.

SUMMARY OF THE INVENTION

An object of the invention is to provide a static flip-flop circuit capable of operation with a low level clock control signal.

Other objects, features and advantages of the invention will become apparent from the following description with reference to the accompanying drawings.

DESCRIPTION OF THE PREFERRED EMBODIMENTS

Figure 1:
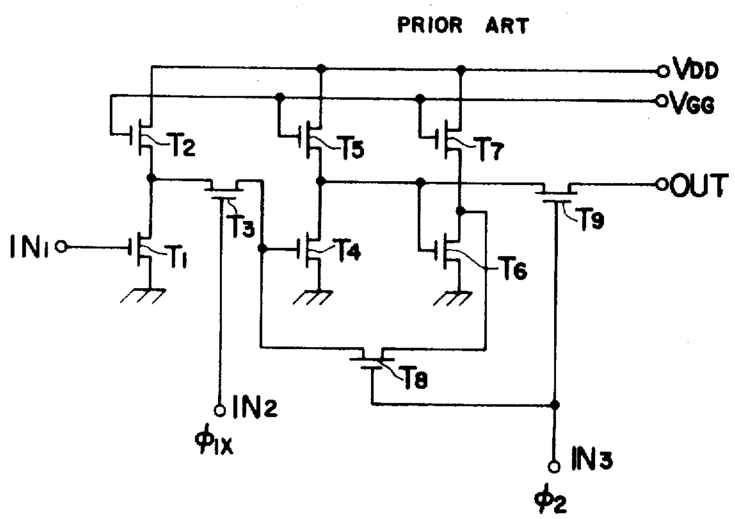
FIG. 1 is a circuit diagram of a conventional static flip-flop circuit using MOS transistors.
Figure 2:
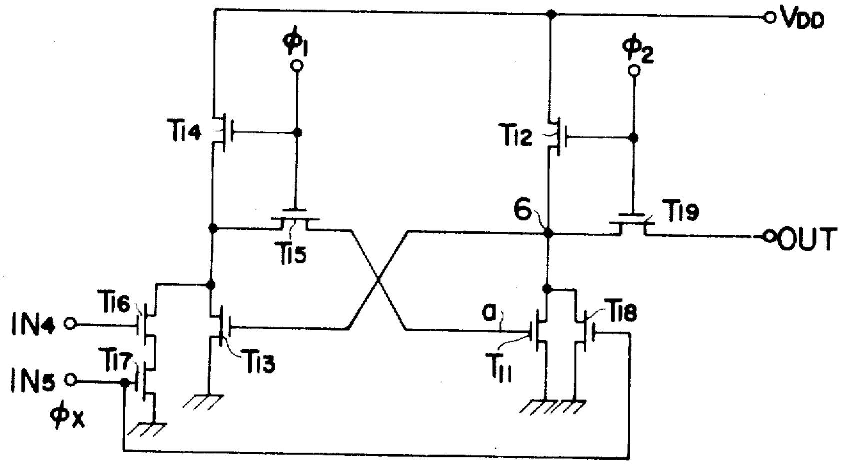
FIG. 2 is a circuit diagram of a static flip-flop circuit according to this invention.

Referring to FIG. 2 there is shown a flip-flop circuit of the invention, wherein the symbol $T_{11}$ denotes a transistor connected between a power terminal $V_{DD}$ and ground by way of a transistor $T_{12}$ which receives a clock signal $\phi_2$ as its input. $T_{13}$ is a transistor having its gate connected to the source electrode of said first transistor $T_{11}$. This transistor $T_{13}$ is connected between the power terminal $V_{DD}$ and ground via a transistor $T_{14}$ which receives a clock signal $\phi_1$ as its input. $T_{15}$ is a transistor supplied with the clock signal $\phi_1$ at its gate electrode and connected between the gate electrode of transistor $T_{11}$ and the source electrode of transistor $T_{13}$. $T_{16}$ is a transistor having its gate electrode connected to an input terminal $IN_4$, and its source electrode connected to the drain electrode of transistor $T_{13}$. $T_{17}$ is a transistor having its gate electrode connected to a clock control input terminal $IN_5$. This transistor $T_{17}$ is connected between the drain electrode of transistor $T_{16}$ and ground. $T_{18}$ is a transistor connected between the source electrode of transistor $T_{11}$ and ground and having its gate electrode connected to the input terminal $IN_5$. $T_{19}$ is a transistor connected between the source electrode of transistor $T_{11}$ and an output terminal OUT and supplied with the clock signal $\phi_2$. The transistors $T_{11}$ through $T_{19}$ are of the MOS type. The transistors $T_{12}$ and $T_{14}$ operate as load resistors. The transistors $T_{11}$ and $T_{13}$ operate as amplifier elements whose gate internal capacity is used for storage purposes. The clock signals $\phi_1$ and $\phi_2$ are of a high voltage level generated by an astable multivibrator or the like. The clock control signal $\phi_x$ is provided through a logic operation between the clock signal $\phi_1$ and another pulse signal. Thus, this clock control signal $\phi_x$ is approximately synchronous with the clock signal $\phi_1$, and has nearly the same voltage level as the input signal (lower than $\phi_1$ and $\phi_2$) applied to the input terminal $IN_4$.

Figures 3A, 3B, 3C, 3D, 3E, 3F, 3G:
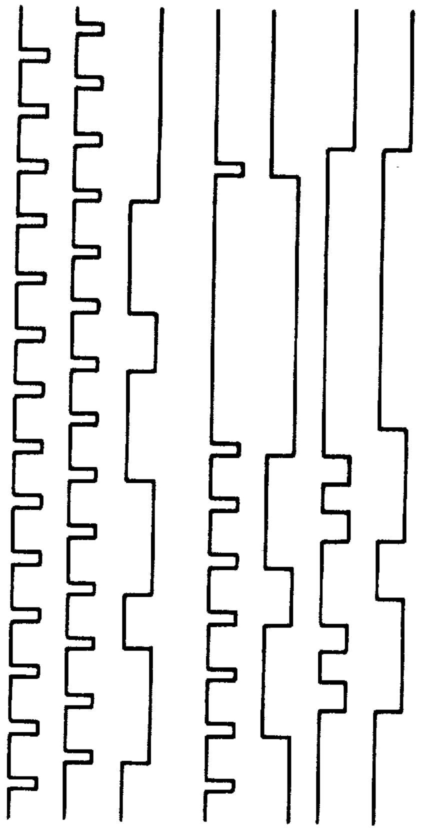
FIGS. 3*a*-3*g* are waveform diagrams illustrating operations of the circuit of FIG. 2.

This flip-flop circuit operates in the following manner. Assume that the clock signals $\phi_1$ and $\phi_2$ as shown in FIGS. 3(*a*) and 3(*b*) are supplied to the circuit. When an input signal of FIG. 3(*c*) is applied to the input terminal $IN_4$, and a control signal $\phi_x$ of FIG. 3(*d*) provided through a logic circuit (not shown) is applied to the input terminal $IN_5$, the transistor $T_{17}$ turns on in response to the control signal $\phi_x$. The transistors $T_{14}$ and $T_{15}$ perform on/off action synchronously with the clock signal $\phi_1$. The transistor $T_{16}$ performs on/off action in response to the input signal. As a result, the potential at the point *a* which serves as the gate signal to the transistor $T_{11}$ assumes "0" level when the transistors $T_{14}$ through $T_{17}$ are in the "on" state, as shown in FIG. 3(*e*), or assumes the "1" level when either the input signal or the control signal $\phi_x$ is zero, i.e., when one of the transistors $T_{16}$ and $T_{17}$ is in the "off" state. The transistor $T_{12}$ performs on/off action synchronously with the clock signal $\phi_2$, and the transistor $T_{18}$ performs on/off action synchronously with the control signal $\phi_x$; as a consequence, the potential at the point *b* assumes the "1" level when only the transistor $T_{12}$ is on, or assumes "0" level when at least one of the transistors $T_{11}$ and $T_{18}$ is on, as shown in FIG. 3(*f*).

The potential at the point *b* is applied to the gate electrode of transistor $T_{13}$, to operate the transistor $T_{13}$ in correspondence to the potential at the point *b* whereby a feedback loop is formed. The transistor $T_{19}$ connected between the point *b* and the output terminal OUT performs on/off action in synchronism with the clock signal $\phi_2$. As a result, the signal of FIG. 3(*g*) appears at the output terminal OUT, and the input signal is applied to the output terminal OUT with a delay equal to the phase difference between the clock signals $\phi_1$ and $\phi_2$ only while the control signal $\phi_x$ is applied. Thus, when the control signal $\phi_x$ is discontinued, this state will remain in storage.

In this operation there is no fear of creating substrate effects because the transistors $T_{17}$ and $T_{18}$ to which the control signal $\phi_x$ is supplied have their source electrodes grounded. Therefore, these transistors can easily be driven by the low level control signal $\phi_x$. The transistor $T_{16}$ is grounded via the transistor $T_{17}$, and is operated for reading the input signal only when the transistor $T_{17}$ is in the "on" state. This means that the source electrode of transistor $T_{16}$ is directly grounded when the transistor $T_{17}$ is on. Hence, the input signal to the input terminal $IN_4$ may be of low voltage. This permits the transistor $T_{16}$ to be supplied with the control signal $\phi_x$, and the transistor $T_{17}$ to be supplied with the input signal.

It is apparent that the invention is not limited to this embodiment but various changes and modifications may be made on this embodiment. For example, a DC voltage may be applied to the gate electrodes of the load transistors $T_{12}$ and $T_{14}$, thus forming a DC drive circuit.

According to the invention, as has been described, there is no fear of causing substrate effects in the MOS transistor to which the clock control signal is supplied, which makes it possible to drive the flip-flop circuit easily and securely by a low level clock control signal.

While there has been shown and described but one embodiment of the invention, it will be understood by those skilled in the art that numerous modifications may be made without departing from the true spirit and scope of the invention as defined in the appended claims.

What is claimed is:

1. A flip-flop circuit comprising: a bias voltage source, a first field effect transistor having its output electrode connected by a first load resistance means to said bias voltage source; a second field effect transistor having its output electrode connected by a second load resistance means to said bias voltage source and its input electrode connected to the output electrode of said first field effect transistor; a third field effect transistor connected between the input electrode of said first field effect transistor and the output electrode of said second field effect transistor; a fourth field effect transistor connected in parallel to said first field effect transistor; a fifth field effect transistor and a sixth field effect transistor connected in series to each other and in parallel to said second field effect transistor; and a seventh field effect transistor connected to the output electrode of said first field effect transistor; first means for applying a first pulse signal to the input electrode of said third field effect transistor, second means for applying a second pulse signal substantially synchronized with said first pulse signal to the input electrode of one of said fifth and sixth field effect transistors and to the input electrode of said fourth field effect transistor, third means for applying an input signal to the input electrode of the other of said fifth and sixth field effect transistors, and fourth means for applying a third pulse signal having its phase different from that of said first pulse signal to the input electrode of said seventh field effect transistor.

2. A flip-flop circuit as defined in claim 1 wherein said first load resistance means is an eighth field effect transistor connected between the output electrode of said first field effect transistor and said bias voltage source.

3. A flip-flop circuit as defined in claim 2 wherein the input electrode of said eighth field effect transistor is connected to said fourth means.

4. A flip-flop circuit as defined in claim 2 wherein a second bias voltage source is connected to the input electrode of said eighth field effect transistor.

5. A flip-flop circuit as defined in claim 2 wherein said second load resistance means is a ninth field effect transistor connected between the output electrode of said second field effect transistor and said bias voltage source.

6. A flip-flop circuit as defined in claim 5 wherein the input electrode of said ninth field effect transistor is connected to said first means.

7. A flip-flop circuit as defined in claim 5 wherein a second bias voltage source is connected to the input electrode of said ninth field effect transistor.

8. A flip-flop circuit as defined in claim 6 wherein the input electrode of said eighth field effect transistor is connected to said fourth means.

* * * * *